(12) United States Patent
Avoyan et al.

(10) Patent No.: US 9,748,078 B2
(45) Date of Patent: Aug. 29, 2017

(54) DUAL PHASE CLEANING CHAMBERS AND ASSEMBLIES COMPRISING THE SAME

(71) Applicant: Lam Research Corporation, Fremont, CA (US)

(72) Inventors: Armen Avoyan, Oakland, CA (US); Cliff La Croix, Livermore, CA (US); Hong Shih, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/003,485

(22) Filed: Jan. 21, 2016

(65) Prior Publication Data

US 2016/0141153 A1    May 19, 2016

Related U.S. Application Data

(63) Continuation of application No. 13/186,827, filed on Jul. 20, 2011, now Pat. No. 9,245,719.

(51) Int. Cl.
*B08B 3/00* (2006.01)
*B08B 3/02* (2006.01)
(Continued)

(52) U.S. Cl.
CPC .......... *H01J 37/32862* (2013.01); *B08B 3/00* (2013.01); *B08B 3/02* (2013.01);
(Continued)

(58) Field of Classification Search
CPC .... B08B 3/00; B08B 3/02; H01J 21/00; H01J 37/32532; H01J 37/32862; H01L 21/00
(Continued)

(56) References Cited

U.S. PATENT DOCUMENTS 4,534,816 A * 8/1985 Chen ................... H01J 37/3244
156/345.37
6,073,577 A 6/2000 Lilleland et al.
(Continued)

OTHER PUBLICATIONS

Office Action dated Apr. 8, 2015 from U.S. Appl. No. 13/186,827.
(Continued)

*Primary Examiner* — Michael Barr
*Assistant Examiner* — Levon J Shahinian
(74) *Attorney, Agent, or Firm* — Beyer Law Group LLP

(57) ABSTRACT

In one embodiment, a dual phase cleaning chamber may include a turbulent mixing chamber, a fluid diffuser, an isostatic pressure chamber and a rupture mitigating nozzle. The turbulent mixing chamber may be in fluid communication with a first fluid inlet and a second fluid inlet. The fluid diffuser may be in fluid communication with the turbulent mixing chamber. The rupture mitigating nozzle may include a first fluid collecting offset, a second fluid collecting offset, and a displacement damping projection. The displacement damping projection may be disposed between the first and second fluid collecting offset and may be offset away from each of the first fluid collecting offset and the second fluid collecting offset, and towards the fluid diffuser. A pressurized cleaning fluid introduced from the first fluid inlet, the second fluid inlet, or both flows through the outlet passage of the first and second fluid collecting offset.

16 Claims, 4 Drawing Sheets

(51) Int. Cl.
*H01J 21/00* (2006.01)
*H01J 37/32* (2006.01)
*H01L 21/00* (2006.01)

(52) U.S. Cl.
CPC ........ *H01J 21/00* (2013.01); *H01J 37/32532* (2013.01); *H01L 21/00* (2013.01)

(58) Field of Classification Search
USPC ............. 134/94.1, 104.2, 108, 902; 156/281, 156/345.26, 345.29, 345.31
See application file for complete search history.

(56) References Cited

U.S. PATENT DOCUMENTS

| | | | |
|---|---|---|---|
| 6,148,765 A | 11/2000 | Lilleland et al. | |
| 6,194,322 B1 | 2/2001 | Lilleland et al. | |
| 6,245,192 B1 | 6/2001 | Dhindsa et al. | |
| 6,376,385 B2 | 4/2002 | Lilleland et al. | |
| 6,916,412 B2 | 7/2005 | Woodruff et al. | |
| 2004/0020599 A1 | 2/2004 | Tanaka et al. | |
| 2005/0241765 A1 | 11/2005 | Dhindsa et al. | |
| 2007/0068629 A1 | 3/2007 | Shih et al. | |
| 2007/0091538 A1 | 4/2007 | Buchberger, Jr. et al. | |
| 2007/0235660 A1 | 10/2007 | Hudson | |
| 2007/0284246 A1 | 12/2007 | Keil et al. | |
| 2010/0126666 A1 | 5/2010 | Tandou et al. | |
| 2011/0126710 A1 | 6/2011 | McDermott et al. | |
| 2013/0019907 A1 | 1/2013 | Avoyan et al. | |

OTHER PUBLICATIONS

International Search Report from International Application No. PCT/US2012/046579 dated Jan. 2, 2013.
Written Opinion from International Application No. PCT/US2012/046579 dated Jan. 2, 2013.

\* cited by examiner

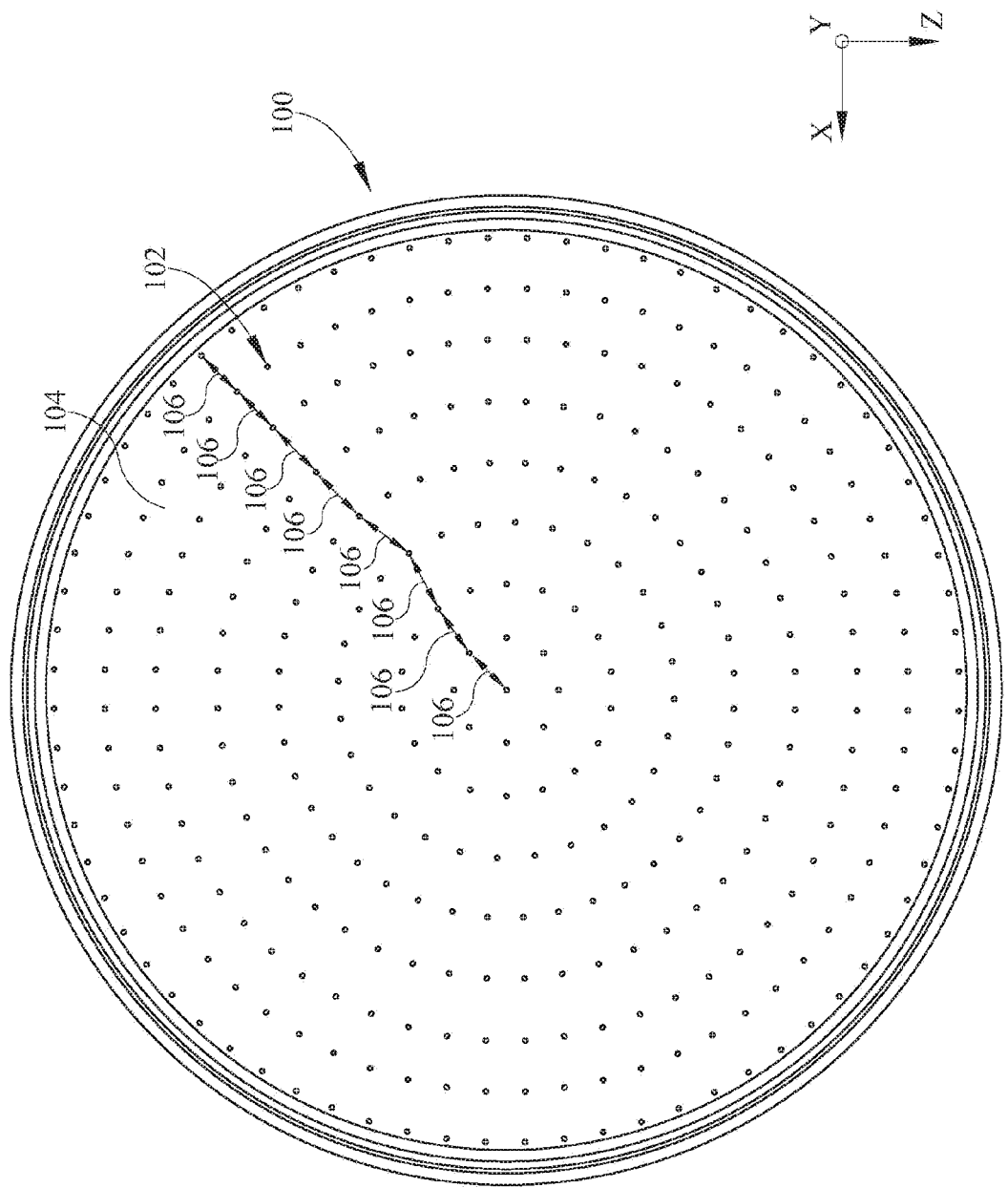

DUAL PHASE CLEANING CHAMBERS AND ASSEMBLIES COMPRISING THE SAME

CROSS REFERENCE TO RELATED APPLICATIONS

This application is a Continuation of U.S. patent application Ser. No. 13/186,827, filed on Jul. 20, 2011, entitled "Dual Phase Cleaning Chambers and Assemblies Comprising the Same" which is incorporated herein by reference in its entirety for all purposes.

SUMMARY

The present disclosure relates generally to dual phase cleaning chambers and, more particularly, to dual phase cleaning chambers for cleaning the gas passages of silicon-based electrodes that are used as excitation electrodes in plasma processing systems. Although the context of the present disclosure is not limited to particular types of electrodes or the context in which the electrodes to be polished have been used, for the purposes of illustration, the dual phase cleaning chambers are illustrated herein with reference to a mono silicon-based electrode having a disc-shape with concentrically arranged gas passages. Those practicing the embodiments described herein will find that some of the dual phase cleaning chambers proposed herein will enjoy favorable utility in the context of a variety of types of electrodes and non-electrodes. Moreover, electrodes with backing plates adhered to a silicon based portion of the electrode may be cleaned or refurbished as described herein.

FIG. 1 illustrates a dual phase cleaning chamber 10 coupled to a silicon-based electrode 100 having a disc-shape. FIG. 4 illustrates a silicon-based electrode. Further teachings regarding the structure of silicon-based electrodes and electrode assemblies similar to that illustrated in FIGS. 1 and 4 can be found in US Pub. Nos. 2007/0068629, 2007/0235660, and 2007/0284246, pertinent portions of which are incorporated herein by reference. Additional related teachings can be found in U.S. Pat. Nos. 6,073,577, 6,148,765, 6,194,322, 6,245,192, and 6,376,385, and US Pub. No. 2005/0241765.

In one embodiment, a dual phase cleaning chamber may include a turbulent mixing chamber, a fluid diffuser, an isostatic pressure chamber and a rupture mitigating nozzle. The turbulent mixing chamber may be in fluid communication with a first fluid inlet for providing a first phase and a second fluid inlet for providing a second phase. The fluid diffuser may include a turbulent facing surface, an isostatic facing surface and a plurality of diffusing flow-paths between the turbulent facing surface and the isostatic facing surface. The fluid diffuser may be in fluid communication with the turbulent mixing chamber such that the turbulent facing surface of the fluid diffuser is facing the turbulent mixing chamber. The rupture mitigating nozzle may include a first fluid collecting offset, a second fluid collecting offset, and a displacement damping projection. The isostatic pressure chamber may be in fluid communication with the fluid diffuser such that the isostatic facing surface of the fluid diffuser is facing the isostatic pressure chamber. The displacement damping projection may be disposed between the first and second fluid collecting offset. The displacement damping projection may be offset away from each of the first fluid collecting offset and the second fluid collecting offset, and towards the fluid diffuser. Each of the first fluid collecting offset and the second fluid collecting offset may include an outlet passage in fluid communication with an ambient pressure. The rupture mitigating nozzle may be in fluid communication with the fluid diffuser such that a pressurized cleaning fluid introduced from the first fluid inlet, the second fluid inlet, or both flows through the outlet passage of the first and second fluid collecting offset.

In another embodiment, a dual phase cleaning chamber may include a turbulent mixing chamber, a fluid diffuser, an isostatic pressure chamber, and a rupture mitigating nozzle. The turbulent mixing chamber may be in fluid communication with a first fluid inlet and a second fluid inlet. The fluid diffuser may include a turbulent facing surface, an isostatic facing surface and a plurality of diffusing flow-paths passing from the turbulent facing surface and through the fluid diffuser to the isostatic facing surface. The fluid diffuser may be in fluid communication with the turbulent mixing chamber such that the turbulent facing surface of the fluid diffuser is facing the turbulent mixing chamber and each of the first fluid inlet and the second fluid inlet is not directly aligned with the diffusing flow-paths of the fluid diffuser. The isostatic pressure chamber may be in fluid communication with the fluid isostatic facing surface of the fluid diffuser is facing the isostatic pressure chamber. The rupture mitigating nozzle may be shaped to receive a silicon-based electrode and may include at least one outlet passage in fluid communication with an ambient pressure. The rupture mitigating nozzle may be in fluid communication with the isostatic pressure chamber such that a pressurized cleaning fluid introduced from the first fluid inlet and/or the second fluid inlet flows through the at least one outlet passage.

In yet another embodiment, a dual phase cleaning assembly may include a turbulent mixing chamber, a fluid diffuser, a silicon-based electrode and a rupture mitigating nozzle. The turbulent mixing chamber may be in fluid communication with the fluid diffuser. The fluid diffuser may be in fluid communication with the silicon-based electrode. The silicon-based electrode may include a plurality of gas passages. The rupture mitigating nozzle may include at least one fluid collecting offset and at least one displacement damping projection. When a pressurized cleaning fluid is injected into the turbulent mixing chamber, the pressurized cleaning fluid may flow through the fluid diffuser, may substantially isostatically impinge the silicon-based electrode, and may flow through the gas passages of the silicon-based electrode. The fluid collecting offset may receive the pressurized cleaning fluid after it passes though the silicon-based electrode. The displacement damping projection may be in contact with the silicon-based electrode.

BRIEF DESCRIPTION OF THE DRAWINGS

The following detailed description of specific embodiments of the present disclosure can be best understood when read in conjunction with the following drawings, where like structure is indicated with like reference numerals and in which:

FIG. 4 schematically depicts a silicon-based electrode according to one or more embodiments shown and described herein.

DETAILED DESCRIPTION

As is noted above, the present disclosure relates to a dual phase cleaning chamber which may be utilized to clean or refurbish electrodes such as silicon-based electrodes after use in a plasma processing chamber. The concepts of the present disclosure should not be limited to particular electrodes or electrode assembly configurations. Thus, electrodes, inner and outer electrodes of multi-component electrode assemblies may be cleaned or refurbished with the embodiments described herein. Moreover, electrodes with backing plates adhered to a silicon based portion of the electrode may be cleaned or refurbished as described herein.

With regard to the silicon-based electrode 100, it is noted that reference herein to a silicon based electrode or an electrode comprising silicon should be read to cover any of a variety of electrodes that utilize any of a variety of forms of silicon in their construction such as, for example, single crystal silicon or polysilicon. In some embodiments, the silicon based electrode may be substantially pure silicon (i.e., silicon with impurities such as a dopant for making n-type or p-type silicon). In further embodiments, electrodes may alternatively or additionally include silicon nitride, silicon carbide, boron carbide, aluminum nitride, aluminum oxide, or combinations thereof.

Figure 1:
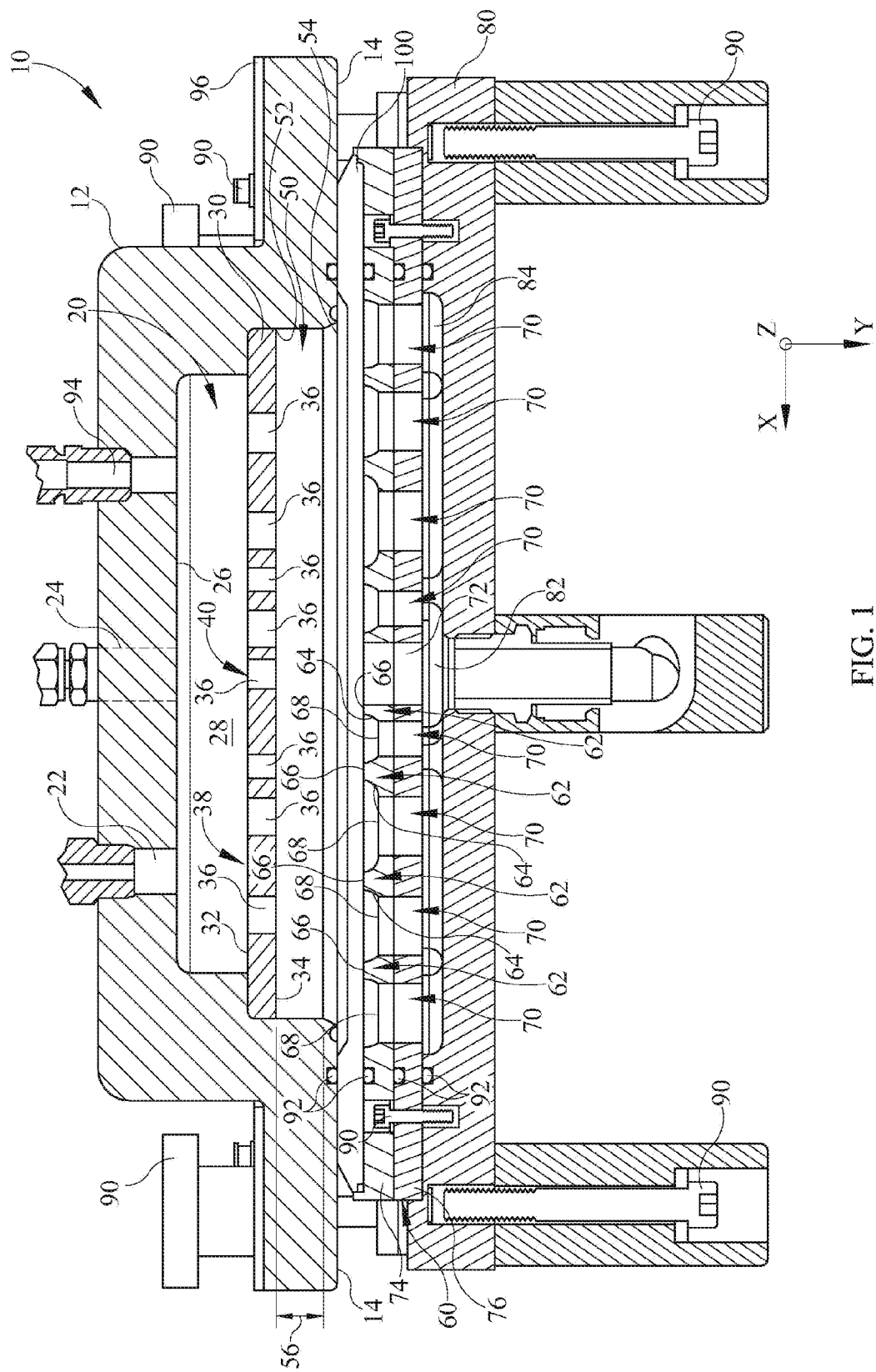
FIG. 1 schematically depicts a cross-section of a dual phase cleaning chamber according to one or more embodiments shown and described herein.

Referring to FIG. 1, a dual phase cleaning chamber 10 comprises a turbulent mixing chamber 20, a fluid diffuser 30, an isostatic pressure chamber 50, and a rupture mitigating nozzle 60. The turbulent mixing chamber 20 is configured to receive and direct fluids along a desired flow path, which is depicted as being directed along the positive Y-direction in FIG. 1. The turbulent mixing chamber 20 comprises a first fluid inlet 22 in fluid communication with a fluid source for providing a first phase and a second fluid inlet 24 in fluid communication with a fluid source for providing a second phase. For the purpose defining and describing the present disclosure, it is noted that the term "fluid" as used herein means a substance, such as a liquid or a gas, that is capable of flowing and that changes its shape at a steady rate when acted upon by a force tending to change its shape such as, for example, clean dry air (CDA), oxygen, water (e.g., deionized water), and the like. Furthermore, it is noted that the phrase "fluid communication," as used herein, means the exchange of fluid from one object to another object, which may include, for example, the flow of compressible and incompressible fluids.

Accordingly, a first phase of CDA can be provided to the turbulent mixing chamber 20 by the first fluid inlet 22 and a second phase of water can be provided to the turbulent mixing chamber 20 by the second fluid inlet 24 simultaneously or asynchronously. Moreover, the first fluid inlet 22 and the second fluid inlet 24 may be operatively coupled to a controller such that the fluid source(s) alternate between supplying fluid to the turbulent mixing chamber 20 simultaneously for a period of time and asynchronously for another period of time during a single cleaning operation. Fluid delivered via each of the first fluid inlet 22 and the second fluid inlet 24 is pressurized in order to promote the flow of the fluid.

Thus, the first fluid inlet 22 and the second fluid inlet 24 may be configured to deliver a recipe of cleaning fluid that may include from about 0% CDA to about 100% CDA and from about 0% water to about 100% water. The first fluid inlet 22 and the second fluid inlet 24 may deliver fluid having a gauge pressure of about 0 psi (about 0 kPa) to about 50 psi (about 344.7 kPa) such as, for example, from about 30 psi (about 206.8 kPa) to about 50 psi (about 344.7 kPa), or from about 35 psi (about 241.3 kPa) to about 45 psi (about 310.3) or about 40 psi (about 275.8 kPa).

In one embodiment, the turbulent mixing chamber 20 comprises a diffuser facing surface 26 and an interior facing surface 28 that constrain the flow of fluid introduced into the turbulent mixing chamber 20. The turbulent mixing chamber 20 may be formed in a housing 12 of the dual phase cleaning chamber 10 such that the flow path begins at the diffuser facing surface 26. Specifically, the first fluid inlet 22 and the second fluid inlet 24 may be formed though the diffuser facing surface 26 of the turbulent mixing chamber 20. Alternatively, the first fluid inlet 22, the second fluid inlet 24, or both may be formed though any surface of the turbulent mixing chamber 20. For example, the first fluid inlet 22, the second fluid inlet 24, or both may be introduced though the interior facing surface 28 of the turbulent mixing chamber 20.

Referring still to FIG. 1, the dual phase cleaning chamber 10 comprises a fluid diffuser 30 for diffusing fluid from the turbulent mixing chamber 20. The fluid diffuser 30 comprises a turbulent facing surface 32, an isostatic facing surface 34 and a plurality of diffusing flow-paths 36 between the turbulent facing surface 32 and the isostatic facing surface 34. Thus, pressurized cleaning fluid introduced to the turbulent facing surface 32 flows through the diffusing flow-paths 36 towards the isostatic facing surface 34. The pressurized cleaning fluid is diffused by the fluid diffuser 30 after the pressurized cleaning fluid flows through the diffusing flow-paths 36 and away from the isostatic facing surface 34 of the fluid diffuser 30.

Figure 2:
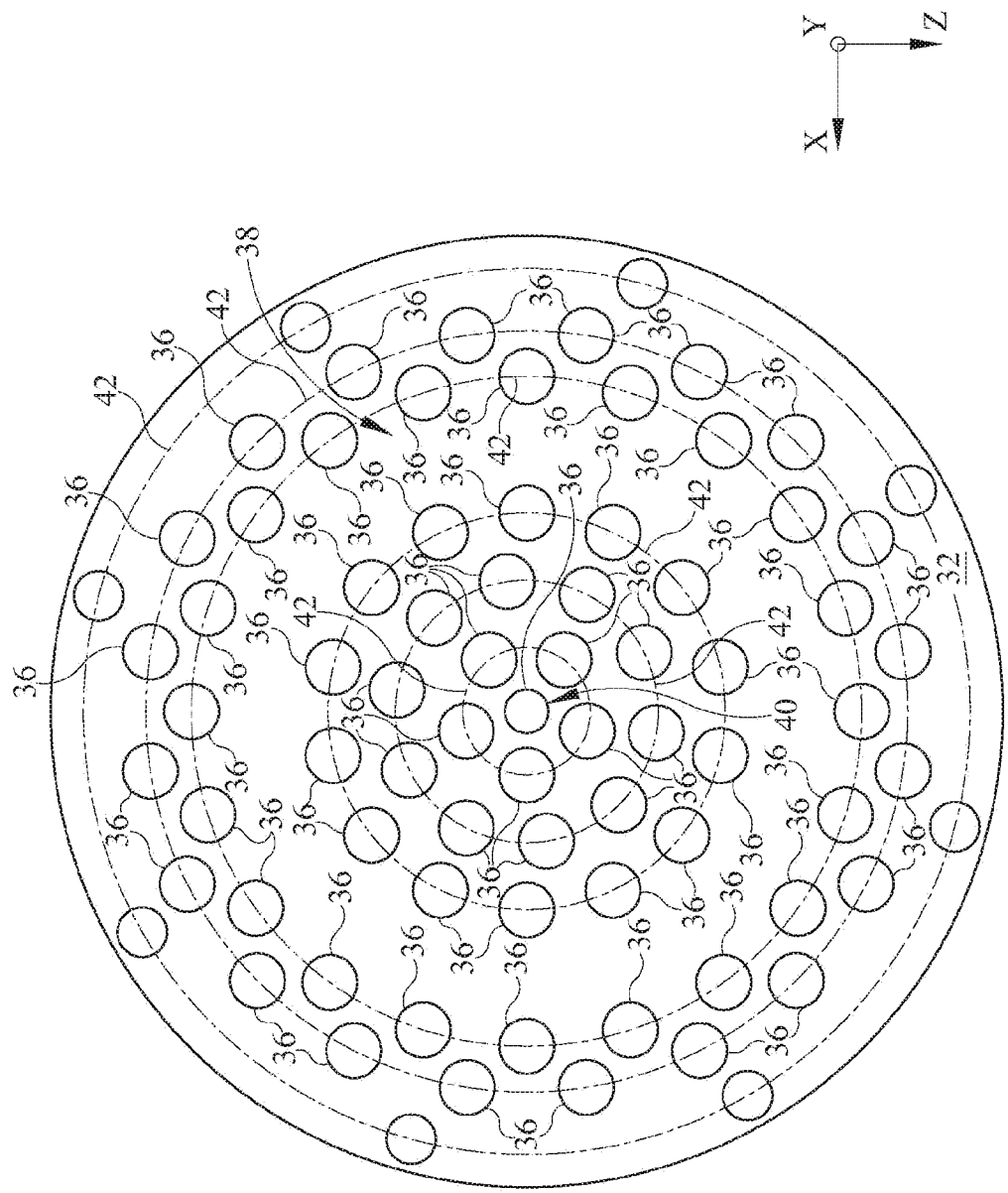
FIG. 2 schematically depicts a fluid diffuser according to one or more embodiments shown and described herein.
Figure 3:
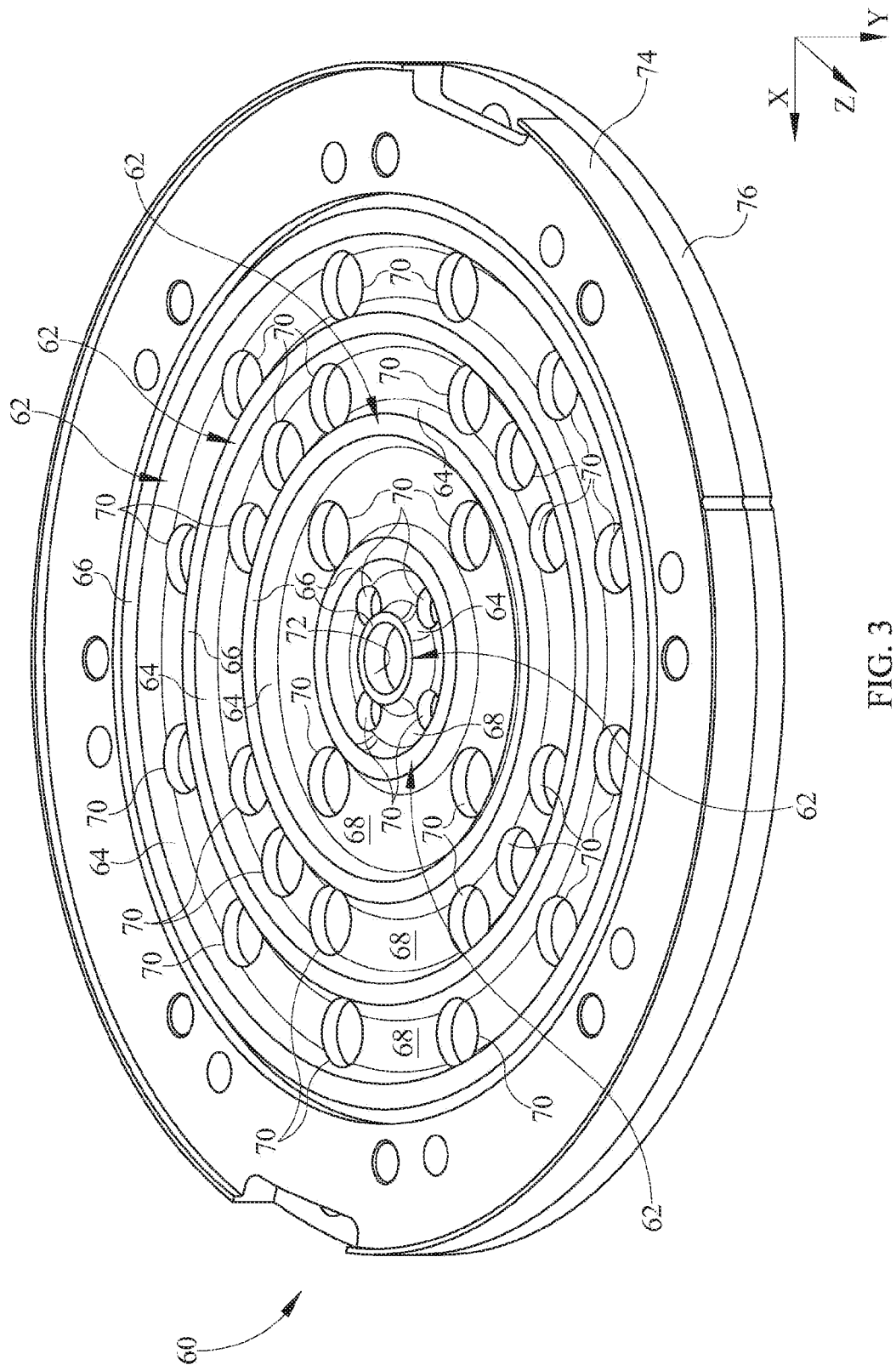
FIG. 3 schematically depicts a rupture mitigating nozzle according to one or more embodiments shown and described herein.

Referring to FIG. 2, in one embodiment, the fluid diffuser 30 comprises a diffusing flow-path 36 passing through the center region 40 of the fluid diffuser 30. An increased number of the diffusing flow-paths 36 can be arranged in concentric arrays 42 that surround the center region 40 of the fluid diffuser 30. In some embodiments, the number of diffusing flow-paths 36 in each concentric array 42 increases as the circumference of the concentric array 42 increases, i.e., the number of diffusing flow-paths 36 increase in each concentric array 42 the further the array is spaced from the center region 40 of the fluid diffuser 30 on the X-Z plane.

In some embodiments, the diffusing flow-paths 36 are substantially straight (e.g., the center of each flow path is substantially aligned with the Y-axis). It is noted that, while the diffusing flow-paths 36 are depicted in FIG. 2 as having a substantially circular cross-section, the diffusing flow-paths 36 may have any cross-sectional shape such as, for example, oval, polygon, or combinations thereof. In further embodiments, the diffusing flow-paths 36 may be rotated with respect to the Y-axis such that the pressurized cleaning fluid flow is directed in a direction other than along the Y-axis. Moreover, each of the diffusing flow-paths 36 may be tortuous such that the diffusing flow-path 36 changes direction as it passes through the fluid diffuser 30.

The turbulent facing surface 32 of the fluid diffuser 30 comprises a mixing region 38 for mitigating the flow of fluid through the fluid diffuser. Accordingly, the mixing region 38 is the portion of the turbulent facing surface that does not include any diffusing flow-paths 36. The mixing region 38 may be a concentric region disposed between two of the concentric arrays 42 of diffusing flow-paths 36. It is noted that, while FIG. 2 depicts the fluid diffuser 30 as a circular object, the fluid diffuser 30 may be any shape and may comprise diffusing flow-paths 36 and mixing regions 38 of any geometry suitable for use with a showerhead electrode, as is described in greater detail below.

Referring again to FIG. 1, the dual phase cleaning chamber 10 comprises an isostatic pressure chamber 50 for directing the pressurized cleaning fluid from the isostatic facing surface 34 of the fluid diffuser 30 along a fluid flow path. The pressurized cleaning fluid exits the isostatic pressure chamber 50 in a substantially isostatic manner, i.e., the pressurized cleaning fluid exerts a substantially constant pressure throughout a cross-section of the pressurized cleaning fluid (e.g., along an X-Z plane) or the pressurized cleaning fluid exerts a substantially constant pressure along a cross-section of an object (e.g., along an X-Z plane) placed in the flow path of the pressurized cleaning fluid.

The isostatic pressure chamber 50 comprises a chamber inlet 52 configured to accept a pressurized cleaning fluid and a chamber outlet 54 configured to eject the pressurized cleaning fluid in a substantially isostatic manner. The chamber inlet 52 is spaced a chamber height 56 away from the chamber outlet 54. The isostatic pressure chamber may have a chamber height 56 sufficient for the pressurized cleaning fluid exiting from the isostatic facing surface 34 of the fluid diffuser 30 to form in a substantially isostatic manner. In one embodiment, the chamber outlet 54 may be shaped to have a larger cross-sectional area (e.g., measured along the X-Z plane) than the chamber inlet 52.

Referring still to FIG. 1, the dual phase cleaning chamber 10 comprises a rupture mitigating nozzle 60 configured to secure a silicon-based electrode 100 within the flow path of the pressurized cleaning fluid. Accordingly, the rupture mitigating nozzle 60 is shaped to receive a silicon-based electrode 100 and comprises at least one outlet passage 70 in fluid communication with an ambient pressure. Specifically, the rupture mitigating nozzle 60 may control the flow of the pressurized cleaning fluid such that a silicon-based electrode 100 may be the interface between a relatively high pressure with respect to an ambient pressure and the ambient pressure.

Referring collectively to FIGS. 1 and 2, the rupture mitigating nozzle 60 comprises at least one fluid collecting offset 68 and at least one displacement damping projection 62. The fluid collecting offset 68 may be configured to receive and direct the pressurized cleaning fluid away from the displacement damping projection. Each of the fluid collecting offsets 68 comprises at least one outlet passage 70 in fluid communication with ambient pressure.

The displacement damping projection 62 may be configured to resist deflection, such as along the Y-direction. Each of the displacement damping projections 62 may comprise a shaped portion 64 and an electrode contacting portion 66. In one embodiment, the shaped portion 64 extends from the fluid collecting offset 68 to the electrode contacting portion 66. The shaped portion 64 may be any shape suitable to separate (e.g., offset with respect to the Y-axis) the fluid collecting offset 68 from the electrode contacting portion 66. Accordingly, the shaped portion 64 may be, for example, faceted, curved, chamfered, or comprise any other contour configured to separate the fluid collecting offset 68 from the electrode contacting portion 66. Additionally, it is noted that, while the electrode contacting portion 66 is depicted in FIGS. 1 and 2 as being substantially planar, the electrode contacting portion 66 may be any shape suitable to control the displacement of an object supported by the electrode contacting portion 66 when the object is subjected to a pressurized cleaning fluid.

In one embodiment, the rupture mitigating nozzle 60 comprises a first fluid collecting offset 68, a second fluid collecting offset 68, and a displacement damping projection 62. The displacement damping projection 62 may be disposed between the first and second fluid collecting offset 68 and offset away from each of the first and the second fluid collecting offset 68. In some embodiments, the rupture mitigating nozzle 60 comprises a center outlet passage 72 in fluid communication with ambient pressure. In further embodiments, a plurality of displacement damping projections 62, a plurality of fluid collecting offsets or both may be arranged substantially concentrically with respect to the center outlet passage 72.

The rupture mitigating nozzle 60 may further comprise an electrode contacting member 74 and a structural member 76. The electrode contacting member 74 may be made of any material that is relatively flexible relative to the silicon-based electrode 100 such as, for example, plastic. The structural member 76 may be made of any material that is relatively rigid relative to the silicon-based electrode 100 such as, for example, stainless steel. According to the embodiments described herein, any portion of the rupture mitigating nozzle 60 (e.g., the displacement damping projection 62) that is configured to be placed in contact with may be formed by the electrode contacting member 74. Moreover, any other portion of the rupture mitigating nozzle may be formed by the electrode contacting member 74. Thus, while the electrode contacting member 74 is depicted in FIG. 1 as forming displacement damping projections 62, fluid collecting offsets 68, and a portion of the outlet passages and the center outlet passage 72, any portion of the rupture mitigating nozzle 60 may be formed by the electrode contacting member 74 or the structural member 76. Additionally it is noted that, while the electrode contacting member 74 and the structural member 76 are depicted in FIG. 1 as plates coupled to one another via clamping members 90, the electrode contacting member 74 and the structural member 76 may be integral or the structural member 76 may be coated with the electrode contacting member 74.

Referring again to FIG. 1, in one embodiment, the dual phase cleaning chamber 10 comprises a turbulent mixing chamber 20, a fluid diffuser 30, an isostatic pressure chamber 50, and a rupture mitigating nozzle 60, each in fluid communication. Specifically, the fluid diffuser 30 is in fluid communication with the turbulent mixing chamber 20 such that the turbulent facing surface 32 of the fluid diffuser 30 is facing the turbulent mixing chamber 20. The isostatic pressure chamber 50 is in fluid communication with the fluid diffuser 30 such that the isostatic facing surface 34 of the fluid diffuser 30 is facing the isostatic pressure chamber 50. The rupture mitigating nozzle 60 is in fluid communication with the isostatic pressure chamber 50 such that a pressurized cleaning fluid introduced from the first fluid inlet 22, the second fluid inlet 24, or both flows through an outlet passage 70 of a fluid collecting offset 68.

The dual phase cleaning chamber 10 may further comprise a base member 80 for supporting the dual phase cleaning chamber 10 on a flat surface, i.e., for making a "table top" unit. The base member 80 may be in fluid communication with the rupture mitigating nozzle 60. The base member 80 may comprise an ambient pressure inlet 82 in fluid communication with a fluid draining feature 84. In one embodiment, the fluid draining feature 84 of the base member 80 is in fluid communication with the outlet passages 70 of the rupture mitigating nozzle 60 and the ambient pressure inlet is in fluid communication with ambient pressure. Pressurized cleaning fluid flowing to the rupture mitigating nozzle 60 may be communicated to the fluid draining feature 84 and through the ambient pressure inlet 82 to ambient pressure.

Referring collectively to FIGS. 1 and 4, the dual phase cleaning chamber 10 may operate as a pressure vessel that directs a pressurized cleaning fluid through gas passages 102 of a silicon-based electrode 100 positioned between the isostatic pressure chamber 50 and the rupture mitigating nozzle 60. Accordingly, the components of the dual phase cleaning chamber 10 may be sealed to on another via O-rings 92 sealed via a clamping pressure provided by clamping members 90. For example, ambient pressure may only be provided to the dual phase cleaning chamber 10 via the ambient pressure inlet 82 (unless provided by the first or second fluid inlet). Moreover, the gauge pressure in the dual phase cleaning chamber 10 may be regulated by a pressure relief valve 94 in fluid communication with the turbulent mixing chamber 20.

Accordingly, when a silicon-based electrode 100 is positioned between the isostatic pressure chamber 50 and the rupture mitigating nozzle 60 and a pressurized cleaning fluid is injected into the turbulent mixing chamber 20, the gas passages 102 of the silicon-based electrode 100 may be cleaned by the pressurized cleaning fluid. Specifically, the pressurized cleaning fluid can flow through the fluid diffuser 30 such that it substantially isostatically impinges the silicon-based electrode and flows through the gas passages 102 of the silicon-based electrode 100.

In one embodiment, the first fluid inlet 22 and the second fluid inlet 24 may each be aligned with the mixing region 38 of the fluid diffuser 30 such that any pressurized cleaning fluid injected into the turbulent mixing chamber 20 cannot flow through a diffusing flow path 36 without interacting with a mixing region 38 of the fluid diffuser 30. Accordingly, without being bound to any particular theory, it is believed that such interaction between the pressurized cleaning fluid and the mixing region 38 may cause the pressurized cleaning fluid to turbulently churn within the turbulent mixing chamber 20 prior to diffusing through the diffusing flow paths 36 of the fluid diffuser 30.

After the pressurized cleaning fluid flows though the silicon-based electrode 100, the fluid collecting offsets 68 receive the pressurized cleaning fluid. Throughout the cleaning process, the displacement damping projection 62 is in contact with the silicon-based electrode 100. The displacement damping projections 62 of the rupture mitigating nozzle 60 may be configured to contact a limited portion of the silicon-based electrode 100. In one embodiment, the displacement damping projections 62 contact the nonporous portion 104 of the silicon-based electrode 100, i.e., the displacement damping projections 62 contact the silicon-based electrode 100 without preventing fluid from flowing through the gas passages 102. Specifically, the electrode contacting portion 66 of the displacement damping projections 62 have a width that is less than or equal to the lateral hole spacing 106 of the silicon-based electrode 100. Accordingly, the displacement damping projections 62 reduce or prevent the tensile stress in the silicon-based electrode 100 by limiting the distortion of the silicon-based electrode 100 that may be induced by the pressurized cleaning fluid.

For the purposes of describing and defining the present invention it is noted that the terms "substantially" and "about" are utilized herein to represent the inherent degree of uncertainty that may be attributed to any quantitative comparison, value, measurement, or other representation. The terms "substantially" and "about" are also utilized herein to represent the degree by which a quantitative representation may vary from a stated reference without resulting in a change in the basic function of the subject matter at issue.

It is noted that the term "commonly," when utilized herein, is not utilized to limit the scope of the claimed invention or to imply that certain features are critical, essential, or even important to the structure or function of the claimed invention. Rather, these terms are merely intended to identify particular aspects of an embodiment of the present emphasize alternative or additional features that may or may not be utilized in a particular embodiment of the present disclosure. Similarly, although some aspects of the present disclosure are identified herein as preferred or particularly advantageous, it is contemplated that the present disclosure is not necessarily limited to these preferred aspects of the invention.

Furthermore, it is noted that directional references such as, for example, flow path, X-direction, Y-direction, X-axis, Y-axis, X-Z plane and the like have been provided for clarity and without limitation. Specifically, it is noted such directional references are made with respect to the coordinate system depicted in FIGS. 1-4. Thus, the directions may be reversed or oriented in any direction by making corresponding changes to the provided coordinate system with respect to the structure to extend the examples described herein.

Having described the invention in detail and by reference to specific embodiments thereof, it will be apparent that modifications and variations are possible without departing from the scope of the invention defined in the appended claims.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A rupture mitigating nozzle for use in a dual phase cleaning chamber for cleaning an electrode with a plurality of passages, wherein the cleaning chamber has an isostatic pressure chamber, wherein a first side of the electrode is in fluid connection with the isostatic pressure chamber and wherein the rupture mitigating nozzle is on a second side of the electrode, comprising:
   at least one fluid collection offset, wherein when the electrode is received in the dual phase cleaning chamber, the at least one fluid collection offset is configured to be spaced apart from the electrode, forming at least one chamber in fluid connection with the passages in the electrode;
   one or more outlet passages extending from the at least one fluid collection offset and in fluid connection with ambient pressure; and
   one or more displacement damping projections extending from the at least one fluid collection offset and configured to not cover any of the passages in the electrode when the electrode is received in the dual phase cleaning chamber, wherein the at least one fluid collection offset is configured to direct pressurized cleaning fluid away from the one or more displacement damping projections.

2. The rupture mitigating nozzle, as recited in claim 1, further comprising:
   an electrode contacting member configured to receive the electrode, wherein the electrode contacting member further comprises the at least one fluid collection offset and the one or more displacement damping projections; and a structural member coupled to the electrode contacting member and configured to provide structural support when the electrode is received by the electrode contacting member.

3. The rupture mitigating nozzle, as recited in claim 2, wherein the electrode contacting member is made of a material more flexible than the electrode; and wherein the structural member is made of a material more rigid than the electrode.

4. The rupture mitigating nozzle, as recited in claim 3, wherein the electrode contacting member is made of plastic; and wherein the structural member is made of stainless steel.

5. The rupture mitigating nozzle, as recited in claim 1, wherein the electrode is a silicon containing electrode, and wherein the one or more displacement damping projections comprises a material more flexible than the electrode.

6. The rupture mitigating nozzle, as recited in claim 5, wherein the one or more displacement damping projections comprises plastic.

7. The rupture mitigating nozzle, as recited in claim 6, wherein the at least one fluid collection offset is formed from a material more rigid than the electrode.

8. The rupture mitigating nozzle, as recited in claim 7, wherein the material of the at least one fluid collection offset comprises stainless steel.

9. The rupture mitigating nozzle, as recited in claim 1, wherein the at least one fluid collection offset comprises a first fluid collection offset and a second fluid collection offset, and wherein the one or more displacement damping projections comprise a first displacement damping projection between the first fluid collection offset and the second fluid collection offset.

10. The rupture mitigating nozzle, as recited in claim 1, wherein the one or more outlet passages comprise a center outlet passage and wherein the one or more displacement damping projections comprise a plurality of displacement damping projections arranged substantially concentrically with the center outlet passage.

11. The rupture mitigating nozzle, as recited in claim 1, wherein the at least one fluid collection offset comprises a plate.

12. The rupture mitigating nozzle, as recited in claim 1, wherein the displacement damping projections are positioned to allow pressurized cleaning fluid to flow from the isostatic pressure chamber through all of the plurality of passages in the electrode to the one or more outlet passages.

13. The rupture mitigating nozzle, as recited in claim 1, wherein the one or more displacement damping projections comprises plastic.

14. The rupture mitigating nozzle, as recited in claim 1, wherein the at least one fluid collection offset is formed from a material more rigid than the electrode.

15. The rupture mitigating nozzle, as recited in claim 1, wherein the material of the at least one fluid collection offset comprises stainless steel.

16. The rupture mitigating nozzle, as recited in claim 1, wherein the passages in the electrode have a lateral hole spacing and wherein the displacement damping projections at a point of contact have a width that is less than or equal to the lateral hole spacing.

\* \* \* \* \*